United States Patent
Van Ingen Schenau et al.

(10) Patent No.: US 8,304,180 B2
(45) Date of Patent: Nov. 6, 2012

(54) LITHOGRAPHIC APPARATUS AND DEVICE MANUFACTURING METHOD

(75) Inventors: Koen Van Ingen Schenau, Eindhoven (NL); Johannes Henricus Maria Linders, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 1770 days.

(21) Appl. No.: 10/939,966

(22) Filed: Sep. 14, 2004

(65) Prior Publication Data
US 2006/0057471 A1    Mar. 16, 2006

(51) Int. Cl.
G03C 5/00 (2006.01)
G03F 1/00 (2012.01)
G06F 17/50 (2006.01)

(52) U.S. Cl. .............. 430/394; 430/5; 716/116

(58) Field of Classification Search ........ 430/5; 716/19, 20, 21
See application file for complete search history.

(56) References Cited

U.S. PATENT DOCUMENTS

| | | | |
|---|---|---|---|
| 6,114,071 A | 9/2000 | Chen et al. | |
| 6,383,719 B1* | 5/2002 | Bula et al. | 430/312 |
| 6,711,732 B1* | 3/2004 | Dai et al. | 716/19 |
| 6,777,147 B1* | 8/2004 | Fonseca et al. | 430/30 |
| 7,037,626 B2 | 5/2006 | Dirksen et al. | |
| 7,790,335 B2 | 9/2010 | Minami | |
| 2003/0106037 A1 | 6/2003 | Moniwa et al. | |
| 2004/0005089 A1* | 1/2004 | Robles et al. | 382/141 |
| 2004/0043305 A1 | 3/2004 | Park et al. | |
| 2004/0053141 A1 | 3/2004 | Pierrat et al. | |
| 2004/0137677 A1* | 7/2004 | Lowisch et al. | 438/232 |
| 2004/0139418 A1 | 7/2004 | Shi et al. | |
| 2005/0164129 A1 | 7/2005 | Minami | |
| 2005/0268804 A1* | 12/2005 | Van Steenwinckel et al. | 101/483 |

FOREIGN PATENT DOCUMENTS

| | | |
|---|---|---|
| JP | 10-092706 | 4/1998 |
| JP | 10-326006 | 12/1998 |
| JP | 2003-168640 | 6/2003 |
| JP | 2003-209049 | 7/2003 |
| JP | 2004-133426 | 4/2004 |
| WO | 9934417 | 7/1999 |
| WO | WO 99/34417 | 7/1999 |
| WO | 2004-077155 | 9/2004 |

OTHER PUBLICATIONS

G. Vandenberghe et al., "Performance Optimization of the Double Exposure Alternating PSM for (sub-) 100 nm ICs", 21$^{st}$ Annual BACUS Symposium on Photomask Technology, Giang T. Dao, Brian J. Grenon, Editors, Proceedings of SPIE vol. 4562, (2002), pp. 394-405.
Office Action from Japanese Patent Office in corresponding patent application JP2005-265695 dated Sep. 8, 2009.
Japanese Office Action mailed Nov. 12, 2010 in related Japanese patent application No. 2005-265695.

* cited by examiner

Primary Examiner — Mark F Huff
Assistant Examiner — Jonathan Jelsma
(74) Attorney, Agent, or Firm — Pillsbury Winthrop Shaw Pittman LLP

(57) ABSTRACT

Improved complementary phase shift mask (c:PSM) imaging techniques are described, including a method in which scattering bars are provided on the trim mask in order to allow better CD uniformity to be achieved in the double exposure process. The number, size and position of the scattering bars can be optimised to achieve a desired isofocal CD and/or a desired level of sensitivity of the CD to trim exposure energy used in the second exposure step of the c:PSM process. The trim exposure dose can be regulated, and/or the trim width used on the trim mask can be optimised, to compensate for iso-dense bias so as to achieve optical proximity correction.

21 Claims, 7 Drawing Sheets

| Pitch | Line | Space |
|-------|------|-------|
| 130   | 75   | 55    |
| 150   | 90   | 60    |
| 200   | 90   | 110   |
| 300   | 0    | 300   |
| 400   | 80   | 320   |
| 500   | 70   | 430   |
| 1000  | 75   | 925   |
| 1500  | 75   | 1425  |

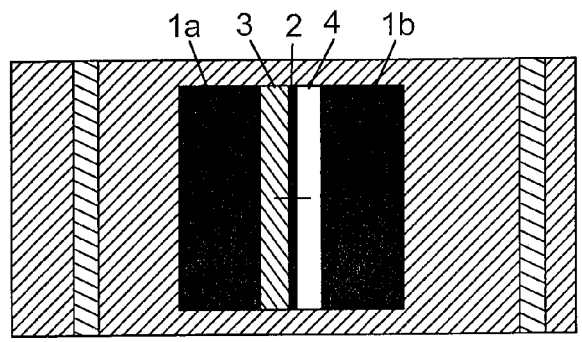
Fig. 4(a)
| Pitch | Line | PW (2x) | Dummy |
|---|---|---|---|
| 130 | 65 | 65 | no |
| 150 | 75 | 75 | no |
| 200 | 65 | 135 | no |
| 300 | 80 | 80 | 60 |
| 400 | 50 | 130 | 90 |
| 500 | 50 | 180 | 90 |
| 1000 | 50 | 180 | 590 |
| 1500 | 50 | 180 | 1090 |
Fig. 4(b)
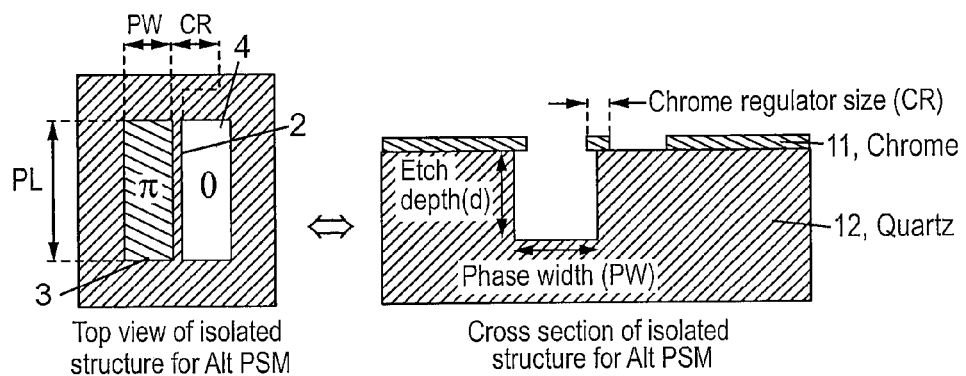
Top view of isolated structure for Alt PSM
Cross section of isolated structure for Alt PSM
Fig. 4(c)   Fig. 4(d)

LITHOGRAPHIC APPARATUS AND DEVICE MANUFACTURING METHOD

This application is related to the commonly owned co-pending U.S. patent applications entitled "System and Method for Replying to Related Messages," U.S. patent application Ser. No. 10/745,495, "System and Method for Building Interest Profiles from Related Messages," U.S. patent application Ser. No. 10/745,589, and "System and Method for Searching and Retrieving Related Messages," U.S. patent application Ser. No. 10/745,588, each filed herewith and incorporated by reference in its entirety.

BACKGROUND OF THE INVENTION

1. Field of the Invention

The present invention relates to a lithographic apparatus and a method for manufacturing a device. In particular, the invention relates to complementary phase shift mask (c:PSM) imaging in lithography.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Imaging Enhancement Techniques (IET) are commonly used by IC manufacturers to push the technical boundaries of the lithographic process to their limits in order to print smaller and smaller features onto the substrate, at or beyond the resolution limit of the lithographic apparatus being used. One form of IET is the Complementary Phase Shift Mask (c:PSM) technique. In c:PSM two exposure steps are employed. In the first exposure a dark field alternating Phase Shift Mask is used to define the gates of the IC to be printed. (The gates are typically dark lines printed on a bright background and connected to larger structures. Gates occur both as densely packed as well as isolated lines.) In the second exposure a binary "trim mask" is used to remove unwanted residual photoresist from the substrate. The trim mask is also used to print features with sizes much larger than the critical dimension (CD) of the gates. The CD is a well-understood term in the art, referring in general to the dimensions of the smallest geometrical features (e.g. width of gate lines, contacts, trenches etc.) which can be formed during semiconductor device/circuit manufacturing using given technology. (The CD is also sometimes referred to as the linewidth or feature width and the term may sometimes simply be used to refer to the width of a particular type of feature, for example gate lines, printed in resist, measured at a specific height above the substrate.) The exposure order of these two exposure steps may alternatively be reversed but for clarity the above-mentioned exposure sequence is maintained throughout this text. Summarized descriptions of the c:PSM technique appear in the following prior art documents:

'Resolution Enhancement Techniques in Optical Lithography', Alfred K. Wong, SPIE press, March 2001;

'Performance optimization of the Double Exposure Alt PSM for sub-100 nm ICs', G. Vandenberghe, BACUS 4562-43.

One disadvantage of the c:PSM technique is that current trim masks may have a negative impact on imaging performance. In particular, the isofocal CD increases significantly (compared with similar processes where the trim step is not used) such that it may not be possible to achieve the required CD uniformity for the gate lines. The CD uniformity, sometimes alternatively referred to as "CD control", is a well understood term in the art, referring to the uniformity of the CD (of a particular type of feature) across an exposure field, a wafer or multiple wafers.

SUMMARY OF THE INVENTION

According to an aspect of the invention, there is provided a lithographic apparatus comprising an illumination system configured to condition a radiation beam; a patterning device; a support constructed to support the patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate, wherein the patterning device comprises a trim mask for use in a complementary phase shift mask imaging process, and wherein the trim mask has at least one scattering bar provided thereon.

According to another aspect of the invention, there is provided a lithographic projection apparatus arranged to project a pattern from a patterning device onto a substrate, wherein the patterning device comprises a trim mask for use in a complementary phase shift mask imaging process, and wherein the trim mask has at least one scattering bar provided thereon.

According to another aspect of the invention, there is provided a trim mask for use in complementary phase shift mask imaging, wherein the trim mask has at least one scattering bar provided thereon.

The trim mask, in this embodiment, has a plurality of scattering bars provided thereon. The trim mask may have a plurality of protective shadow regions provided thereon and the scattering bars may be arranged so that a single scattering bar is disposed on either side of each protective shadow region on the trim mask. Alternatively, the scattering bars may be arranged so that two or more scattering bars are disposed on either side of each protective shadow region on the trim mask.

According to another aspect of the invention there is provided a device manufacturing method utilizing the complementary phase shift mask (c:PSM) imaging technique, the method including projecting a first patterned beam of radiation onto a target portion of a substrate, said first patterned beam being formed using an alternating phase shift mask exposed to a first beam of radiation, projecting a second patterned beam of radiation onto the target portion of the substrate, said second patterned beam being formed using a trim mask exposed to a second beam of radiation, wherein the length of time that the trim mask is exposed to the second beam of radiation, and the intensity of the second beam of radiation, are selected in accordance with at least one feature on the trim mask so as to achieve at least some optical proximity correction.

It will be appreciated that the length of time that the trim mask is exposed to the second beam of radiation, and the intensity of the second beam of radiation, determines the exposure dose at substrate level in the second exposure (herein referred to as the "trim exposure"). In one embodiment the trim mask includes a plurality of protective shadow regions for protecting features (such as, for example, gate lines) formed on the target portion of the substrate using the first patterned beam of radiation, and the exposure dose in the trim exposure is selected (by selecting the period and intensity of the second radiation beam) in accordance with a predetermined width of the protective shadow regions so as achieve a desired critical dimension (CD) of one or more predetermined features, such as gate lines, formed on the target portion of the substrate as a result of the device manufacturing method. Additionally, or alternatively, a width of the protective shadow regions (measured in a direction perpendicular to the features, such as gate lines, which they protect) is selected so as to achieve a desired level of sensitivity of the CD to the exposure dose applied during the trim exposure.

According to another aspect of the invention there is provided a device manufacturing method utilizing the complementary phase shift mask (c:PSM) imaging technique, the method including projecting a first patterned beam of radiation onto a target portion of a substrate, said first patterned beam being formed using an alternating phase shift mask exposed to a first beam of radiation, projecting a second patterned beam of radiation onto the target portion of the substrate, said second patterned beam being formed using a trim mask exposed to a second beam of radiation, wherein the trim mask has at least one scattering bar provided thereon.

The number, size and position of the scattering bars may be optimized so as to achieve a desired isofocal critical dimension (CD) for predetermined features, which may for example be gate lines, formed on the target portion of the substrate using the complementary phase mask imaging process. Alternatively, or additionally, the number, size and position of the scattering bars may be optimized so as to achieve a desired level of sensitivity of the CD (for said predetermined features) to the exposure dose applied during the trim exposure in the c:PSM imaging process.

The alternating phase shift mask may have a plurality of gate lines and a plurality of phase shifter regions formed thereon, each gate line being sandwiched between two said phase shifter regions, and may further include a plurality of dummy regions. Each dummy region is optionally disposed adjacent a said phase shifter region.

The alternating phase shift mask may be a dark field alternating phase shift mask. The trim mask may conveniently be a binary Chrome on Glass (COG) trim mask. Alternatively, the trim mask may be an attenuated phase shift mask (att: PSM).

The exposure dose applied during the trim exposure (hereinafter referred to as the "trim dose") may be non-uniform across the exposure field. In particular, the profile of the trim dose across the exposure field may be shaped so as to achieve at least some optical proximity correction, for example to at least partially compensate for iso-dense bias.

The exposure dose applied during the trim exposure (hereinafter referred to as the "trim dose") may be non-uniform across the substrate. In particular, the profile of the trim dose across the substrate may be shaped so as to achieve at least some optical proximity correction, for example to at least partially compensate for iso-dense bias.

According to another aspect of the invention, there is provided a device manufactured according to any of the above-described methods.

According to another aspect of the invention, there is provided a device manufactured using the above-described apparatus and/or any of the above-described masks.

According to another aspect of the invention there is provided a computer program product for designing complementary phase shift masks (c:PSMs) for lithography, the computer program product comprising: program code for designing an alternating phase shift mask to incorporate a plurality of gate lines and a plurality of phase shift regions; and program code for designing a trim mask to have a plurality of scatter bars provided thereon.

The computer program product optionally further includes program code for optimizing the number, size and position of said scatter bars so as to achieve a desired isofocal critical dimension (CD) in a double exposure imaging technique utilizing the alternating phase shift mask and trim mask so designed. The computer program product may also include program code for designing the alternating phase shift mask to include dummy regions disposed adjacent at least some of said phase shift regions.

The computer program product may be provided in any convenient form, such as a computer-readable medium having said program code stored thereon; electromagnetic signals transmissible over a communications network; or program code stored in a ROM or other computer memory device; and the like.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 4(a) depicts a portion of an improved alternating phase shift mask for use with the invention;

FIG. 4(b) is a table illustrating variation in line and space width, and dummy feature width, with pitch variation for a mask of the type shown in FIG. 4(a);

FIG. 4(c) is a plan view of an isolated structure formed in the mask of FIG. 4(a);

FIG. 4(d) is a cross-sectional view of the mask structure of FIG. 4(c);

DETAILED DESCRIPTION OF EMBODIMENTS OF THE INVENTION

Figure 1:
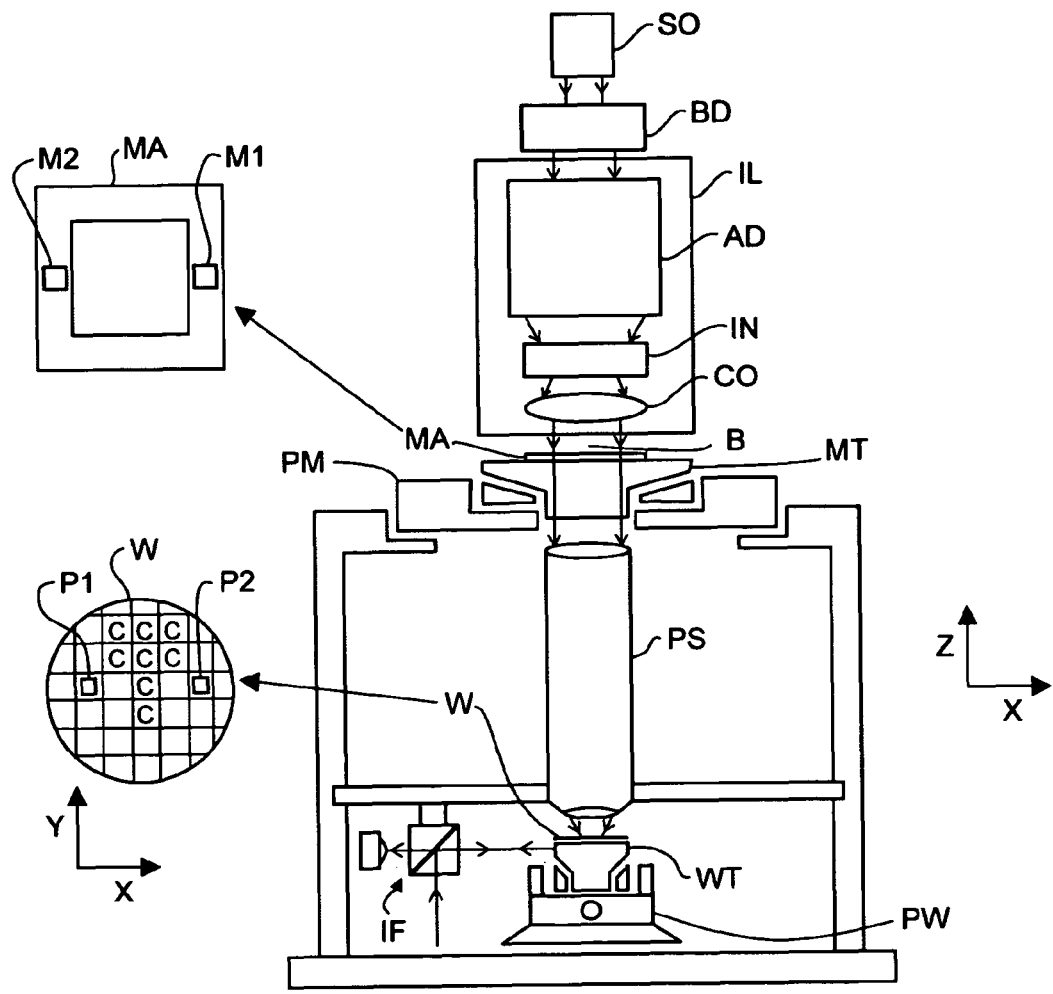
FIG. 1 depicts a lithographic apparatus according to an embodiment of the invention.

FIG. 1 schematically depicts a lithographic apparatus according to one embodiment of the invention. The apparatus includes, an illumination system (illuminator) IL configured to condition a radiation beam B (e.g. UV, DUV radiation or EUV radiation), a support structure (e.g. a mask table) MT constructed to support a patterning device (e.g. a mask) MA and connected to a first positioner PM configured to accurately position the patterning device in accordance with certain parameters, a substrate table (e.g. a wafer table) WT constructed to hold a substrate (e.g. a resist-coated wafer) W and connected to a second positioner PW configured to accurately position the substrate in accordance with certain parameters and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The above apparatus can be used to carry out complementary phase shift mask imaging (c:PSM). In this technique a first exposure of the substrate W is carried out using an alternating phase shift mask (alt:PSM) as the patterning device MA, and then a second exposure of the substrate is carried out in which the alt:PSM is replaced by a binary trim mask. The first exposure is used to image, for example, gate lines on to a target portion of the substrate.

FIG. 2 shows a typical gate pattern on a conventional alternating phase shift mask (alt:PSM). Typically, the gate pattern on such an alt-PSM features a chrome "gate" line 2 and two phase "shifters" 3,4, one on each side of the chrome line. Each phase shifter 3,4 fills the whole width of the space between one gate line 2 and the next gate line (not shown). The shifters 3,4 introduce an 180 degree relative phase shift of an EM wave between parts of the wave at either side of the chrome line 2. Typically, one shifter causes an 180 degree phase shift, whereas the other "shifter" causes a zero degree phase shift (i.e. it actually does not shift a phase of the EM wave). The chrome line 2 and the shifters 3,4 constitute an alt-PSM area, and are therefore sometimes in the literature referred to an "embedded phase shift area". In traditional alt:PSM techniques the width W of the shifters 3,4 (measured in the direction perpendicular to the chrome line 2) is not the same for each gate line 2. This is because in the traditional method the width of the chrome gate lines 2 and the space between adjacent gate lines is varied according to the pitch of the gate lines, in order to adjust for proximity effects (arising from pitch variation). Such proximity effects commonly manifest as a variation in the CD with pitch variation. This CD vs. pitch variation is often termed the "pitch linearity". For AltPSM the space width (between gate lines 2) increases to large values for larger pitches. Table 2(b) illustrates typical variation of gate line width and space width with pitch. In this example, where the pitch varies from 130 to 1500 nm, it can be seen that the gate line width may vary from 0 to 90 nm and the space width from 55 to 1425 nm, where the target CD is 50 nm, the exposure wavelength is 193 nm and the numerical aperture (NA) of the projection system is 0.85. The most important disadvantages of large space widths are:

(1) large proximity effects;
(2) large sensitivity to lens aberrations;
(3) mask manufacturability (poor).

In an improved technique, proposed for use with the present invention, in addition to the chrome gate lines 2 and phase shift areas 3,4, for pitches of 300 nm and larger we further include dummy chrome features on the alt:PSM mask. These take the from of a chrome "background" area formed by two equal width chrome areas 1a,1b, one disposed on either side of (and adjacent to) the embedded phase shift area 2,3,4. An example of this improved alt:PSM mask design is shown in FIG. 4(*a*), for the case where the pitch=1500 nm. In this case the width of each phase shift region 3,4 is 180 nm, the width of the gate line 2 is 50 nm, and the total width of the two dummy chrome features 1a,1b adjacent the phase shift regions is 1090 nm. Table 4(b) illustrates typical variation in gate line width, phase width and (total) dummy feature width with pitch variation, for this improved mask design. It can be seen that with this improved mask the phase width of the phase shift regions varies between 65 and 180 nm for gate line pitch variation between 130 nm and 1500 nm, whereas for the traditional mask shown in FIG. 2(*a*) the space between neighbouring gate lines (which is equal to the width of the phase shift regions) varies between 65 and 1450 nm for the same pitch variation. With the improved mask of FIG. 4(a) proximity effects reduce because the diffraction patterns are more similar for the various pitches. The improved mask also offers additional control over CD vs. pitch variation by being able to select the size of the phase width of the phase shift areas 3,4 (rather than simply matching the phase width of these areas to the space between neighbouring gate lines). Our simulations have shown that with the above mask parameters a flat CD vs. pitch response can be achieved when using a numerical aperture, NA=0.85 for the projection system and an illumination mode, σ=0.2.

Figure 6A:
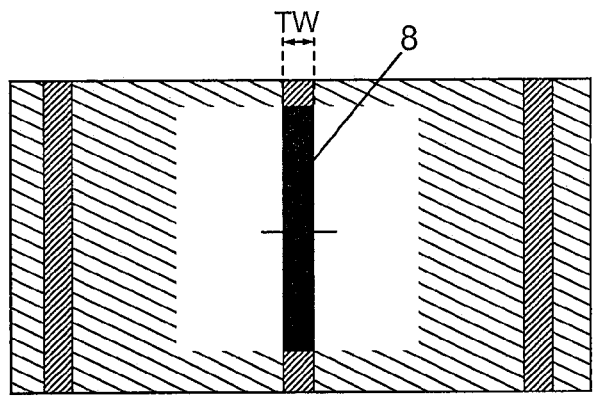
FIG. 6(a) shows a portion of a conventional trim mask.

The second exposure uses a so-called "trim mask" to eliminate residual features from the substrate W. Typically, the above-described printing of gate lines involves a process whereby unexposed resist remains after development, whereas exposed resist is developed away. For example, the above-mentioned chrome dummy features 1a,1b would lead to undesired resist remaining on the substrate (hereinafter also referred to as the "wafer") W if it were not exposed. It has to be "trimmed away", and that is one of the desired effects for which the second exposure with the trim mask is used. However, in addition, the trim mask can also be used to print larger structures (e.g. features with sizes (much) larger than the CD of the gates). Last but not least, the trim mask should feature "protective shadow regions" to protect (against any exposure) the unexposed gate-line image achieved on the substrate from the first exposure. A standard trim mask design for a single embedded phase shift area is shown in FIG. 6(a). The width of the protective shadow regions (PSR) 8 along a line perpendicular to the (respective) gate line 2 shall hereinafter be referred to as the "trim width" (TW). In the example of FIG. 6(a) the trim width of each PSR region 8 is 200 nm and the pitch is 1500 nm. Thus for pitches up to 200 nm (e.g. between 130 and 200 nm) there is complete shielding for the trim exposure, and for pitches of 300 to 1500 nm the trim width is 200 nm. The trim width can be used to control the CD vs. pitch response (i.e. the pitch linearity), as will later be described. After exposure with the trim mask, the unwanted resist features (namely the dummy features 1a,1b) are no longer present.

The trim mask may be a binary Chrome On Glass mask, also referred to as a COG mask, but it may very well also be, in principle, any other type of mask suitable for use in single exposure, such as for example an attenuated Phase Shift Mask (usually abbreviated as att-PSM), as long as it provides the protective shadow regions (embodied as chrome areas) wherever required. FIGS. 4(c) and 4(d) illustrate an isolated structure for an AltPSM mask, showing one embedded phase shift region with background dummy feature. The chrome gate line 2 and dummy features are formed in an upper chrome layer 11 of the mask and the 180 degree phase shifter region 3 is etched into in a lower quartz layer 12 of the mask (on top of which quartz layer is the chrome layer 11). In these figures the phase width of each phase shifter 3,4 is indicated by the reference numerals PW and the chrome gate line width by the reference numerals CR.

Figure 3:
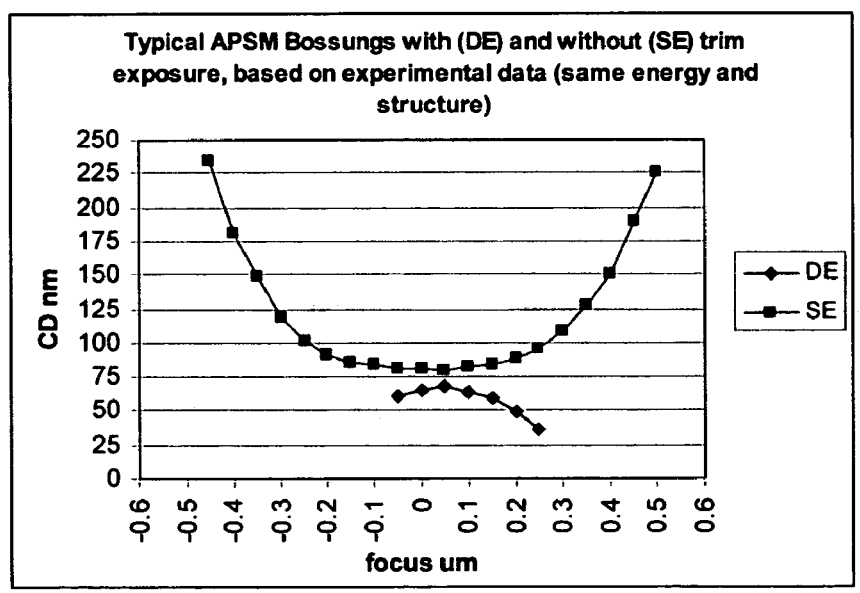
FIG. 3 is a graph depicting Bossung curves (obtained from experiments) for both a double exposure (DE) and a single exposure (SE) imaging process, plotted as critical dimension (CD) against focus.

Conventional trim masks can have a negative impact on imaging performance. In particular, the isofocal CD for the double exposure case can be much higher than for the first "gate defining" exposure alone. This is illustrated by the Bossung curves plotted in FIG. 3 using experimental data for a double exposure (DE) and single exposure (SE) process (where the exposure dose in the alt:PSM exposure step of the DE process is set to be the same as the exposure dose in the SE process, and the pattern to be printed is the same in both the DE and SE processes). As is well-known in the art, a Bossung curve is a plot of the printed CD, after development (e.g. a printed gate line) as a function of the energy and the focal position (relative to the ideal plane of best focus) of the substrate W during exposure. The features of a single CD, focus-position plot (most notably) depend on 1) the exposure dose at wafer level,
2) the proximity of neighbouring lines (dense or isolated), and
3) the NA and illumination mode chosen.

At one specific exposure dose the CD does not vary as function of the focal position of the substrate. At any other exposure dose it does depend on focus. The CD obtained at said one specific exposure dose is termed the "isofocal CD". In practice lithographers tend to try to arrange the process so that the isofocal CD is also the target (i.e. desired) CD to be achieved.

In a double exposure imaging technique such as c:PSM imaging, the necessary second exposure affects the results of the first exposure to at least some extent such that the overall double exposure process is rendered quite focus sensitive i.e. the Bossung curve representing the double exposure process is much more curved than the Bossung curve for the single exposure process. This has the effect that the isofocal CD for the double exposure process tends to be much higher than the isofocal CD for the first "gate defining" exposure alone. For example, in a typical case using a standard trim mask the isofocal CD may increase from 80 nm for the SE process to 116 nm for the DE process. As a consequence it can easily be appreciated that CD uniformity, especially through focus control, degrades significantly in double exposure imaging compared with single exposure imaging. This effect becomes even larger where small σ illumination modes are used (where σ is the pupil filling factor, defined as σ=r/R, where r is the radius of the light source image and R is the radius of the entrance pupil, in the imaging equipment).

In practice in integrated circuits (ICs) to be printed in lithography, gate lines occur with multiple (i.e. different) pitches. Generally, the printed CD of any such gate lines depends on how close neighbouring lines are. As above-mentioned, this effect is termed the "pitch linearity". In the present invention we have found that it is possible to improve the c:PSM process so as to compensate (or at least partially compensate) for pitch linearity effects. This can be done in several ways as follows:

(a) by regulating the exposure dose in the second (i.e. the "trim" exposure) step;

(b) by optimising the width of the PSR regions in the trim mask;

(c) by including assist features, in the form of "scattering bars", on the trim mask;

(d) by optimising the number and position of the scattering bars included on the trim mask.

(e) by optimising the numerical aperture(NA)/illumination of the trim step.

These approaches will be described below in further detail, with reference to FIGS. 5 to 12.

Figures 2A, 2B:
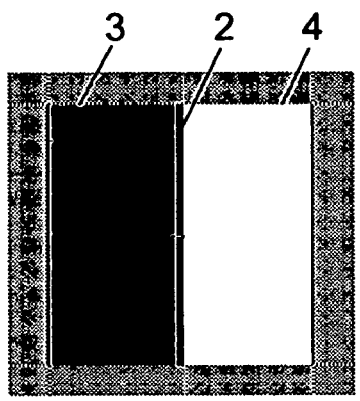
FIG. 2(a) depicts a portion of a conventional alternating phase shift mask.
FIG. 2(b) is a table illustrating variation in line and space width with pitch variation for a mask of the type shown in FIG. 2(a)

We propose that when printing densely packed gate lines with multiple (i.e. different size) pitches on a substrate using an alternating phase shift mask (alt:PSM), it is advantageous to use a phase shift mask of the type shown in FIG. 4(a) which employs dummy features, so that the phase shifter regions 3,4 on the alt:PSM can be designed to be of relatively uniform size for different pitches. Each phase shifter region 3,4 on the mask has a width $W_{ps}$ in a direction perpendicular to the respective gate line 2 adjacent to the phase shifter region (this is the width indicated by reference numerals PW in FIGS. 4(c) and (d)) and we refer herein to this width as the "phase width", $W_{ps}$. Table 4(b) illustrates the variation in line width, phase width and (total) dummy feature width (of the two dummy regions 1a,1b) with pitch variation from 130 to 1500 nm for an example mask of the type shown in FIG. 4(a). It can be seen that in this case the phase width varies between 65 and 180 nm, which is much less than the 65 to 1450 nm phase width variation in the case of the traditional mask type of FIG. 2(a) over the same pitch variation range. As afore-described, for traditional masks of the type shown in FIG. 2(a), the phase width of individual phase shifter regions on the mask is normally determined by the respective gate line pitch of the gate lines adjacent to which the phase shifter regions lie. Advantages of the more uniform phase width approach presented here (compared with the afore-mentioned traditional approach) include:

the alt:PSM is easier to manufacture. This is because phase error in the alt:PSM can be a function of the phase width. This has the effect of image displacement and reduced process windows of the gate lines. By designing a mask with more uniform phase widths, the phase error in the mask can be reduced;

(1) lower sensitivity to lens aberrations, due to the use of smaller phase width $W_{ps}$;

less proximity effects (this is due to the diffraction patterns being more similar for different pitches, than where the traditional Alt:PSM mask of the type shown in FIG. 2(a) is used);

larger overlapping process windows over multiple pitches due to (3).

In the following description we describe how we have further improved the c:PSM imaging process by effectively employing the exposure dose in the second exposure stage (the "trim" exposure) to achieve some iso-dense bias or proximity correction.

Figure 5:
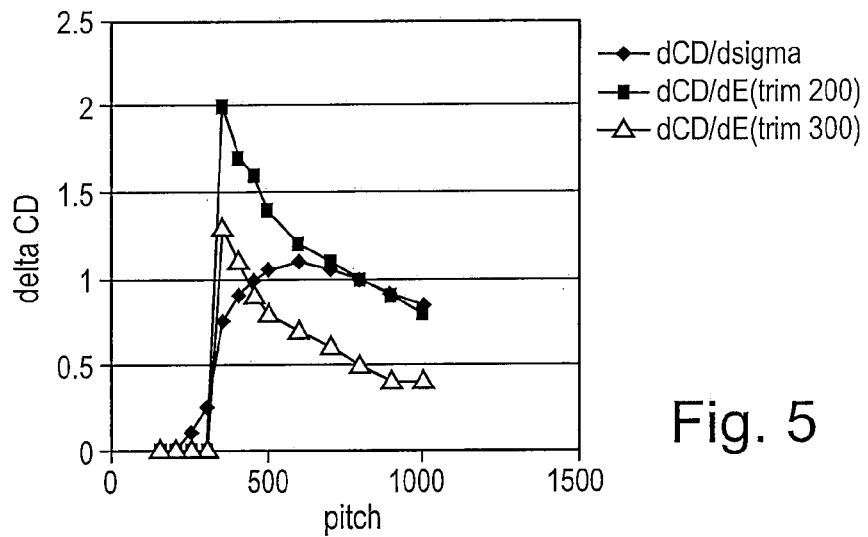
FIG. 5 is a plot of three graphs illustrating sensitivity of printed CD to changes in illumination mode, σ, trim energy, E, and trim width, TW, respectively, for a range of different gate line pitches (these graphs are based on simulated data)

FIG. 5 shows three graphs illustrating respectively the sensitivity of the printed CD (i.e. the change in CD, delta CD, in nanometres) to changes in illumination mode, σ, and also to changes in trim energy, E, for two different trim widths (200 nm and 300 nm trim widths), for a range of different gate line pitches (measured in nm). It can be seen from FIG. 5 that the sensitivity (of the CD) to the trim energy (i.e. the exposure dose) increases for smaller pitches. We have found that this effect can be regulated by adjusting the trim width, TW, of the PSR regions included on the trim mask used in the second exposure process of the c:PSM imaging process. In this manner, the trim mask can be biased (through careful selection of trim width on the trim mask) such as to yield an appropriate desired CD correction for a particular pitch. (This will be described and illustrated further below with reference to FIG. 8).

Taking FIG. 4(a) as an example of a portion of a dark field alt:PSM in which relatively "uniform" phase width phase shifter regions are used, then if, for example, the printed CD of the gate line 2 is 60 nm and the phase width $W_{ps}$ of the phase shift regions 3,4 is 200 nm, then "dummy features" (i.e. unexposed resist) will appear on the substrate (between phase shift regions which face one another) where the gate line pitch is greater than for example 460 nm. For smaller pitches the shifters 3,4, facing each other between two neighbouring gate lines will merge. These dummy features can be removed in the second exposure step using a binary trim mask. We have found that lower isofocal CDs can be achieved by including assist features in the form of scattering bars on the trim mask, while at the same time maintaining a desired level of sensitivity of the CD to trim energy (thereby still allowing CD correction to be performed using careful selection of trim widths, as described above).

Scattering bars are now well known in the art as a proven and effective Optical Proximity Correction (OPC) technique for enhancing wafer imaging performance (i.e. the process window) for today's integrated circuit manufacturing processes. The scattering bars are normally included on the mask which is used to image the gate lines in single exposure imaging techniques, in order to achieve resolution enhancement. Scattering bars are sub-resolution features that are placed on the photomask next to isolated and semi-isolated lines enabling such isolated features (such as gate lines) to image more like dense features, so that the performance of the isolated features are improved. The following parameters govern the application of scattering bar OPC: the width of the scattering bars, the separation of the scattering bars from the edge of the main feature (e.g. gate line), and the number of scattering bars on each side of the main feature. Using scattering bars it is possible to make isolated and semi-isolated features achieve performance comparable to dense features. This effect is well-known in the art (see, for example, "Resolution Enhancement Techniques in Optical Lithography", Alfred K. Wong, SPIE press, March 2001) and therefore will not be described in further detail here. It has never previously been proposed to include scattering bars on the trim mask in a double exposure technique such as c:PSM.

Figure 6B:
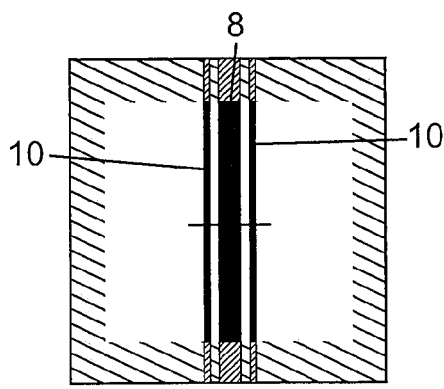
FIGS. 6(b) and (c) show portions of an inventive trim mask provided with single or double scattering bars respectively.
Figure 6C:
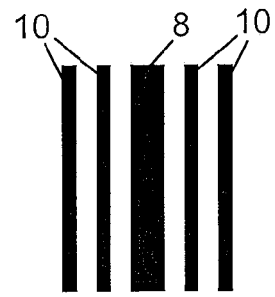
Figure 7:
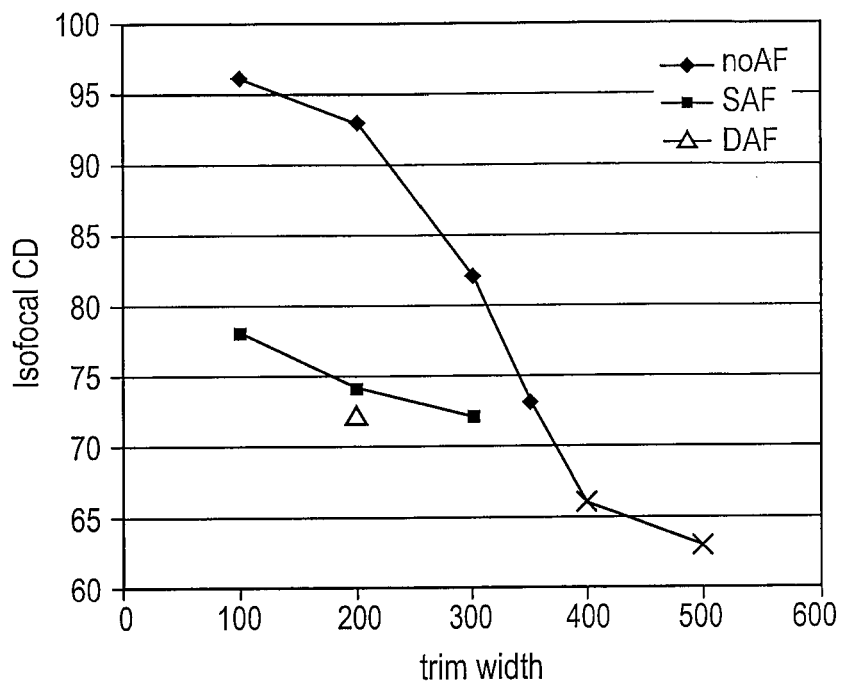
FIG. 7 is a graph of isofocal CD plotted against trim width, for three different trim masks.

We have designed and used binary trim masks incorporating single, double or more scattering bars 10 disposed along the side of each PSR 8, parallel to the respective gate line. FIGS. 6(b) and (c) illustrate portions of two such trim masks provided with single or double scattering bars 10 respectively. In the trim mask of FIG. 6(b) the main PSR region has a width of 120 nm, each scattering bar 10 has a width of 30 nm and is spaced from the main PSR region by 60 nm, and the pitch is 1500 nm. FIG. 7 is plotted using data from our model experiments and illustrates the effect of including these scattering bars on the trim mask for different trim width, TW, of the PSR regions. FIG. 7 plots the resulting isofocal CD of the overall double exposure c:PSM process against the trim width for the case as in FIG. 6(a) where no assist features (i.e. scattering bars) are included on the trim mask (graph labelled "noAF"), the case as in FIG. 6(b) where single scattering bars are placed on each side of each PSR (graph labelled SAF), and the case as in FIG. 6(c), where two (spaced) scattering bars are placed on each side of each PSR (graph labelled DAF). From FIG. 7 it can be seen that when no scattering bars are used on the trim mask, lower isofocal CD can be achieved by using larger trim widths. However, trim widths larger than about 350 nm are not feasible in the case of 200 nm phase width (of the phase shifter regions 3,4) because the dummy features 1a,1b in resist would not be removed in the trim exposure process. FIG. 7 illustrates that where single or double assist features (in the form of scattering bars) are used on the trim mask the isofocal CD is at a desired lower level (than where no assist features are used) for smaller trim widths (namely between 100 and 300 nm trim width).

Figure 8:
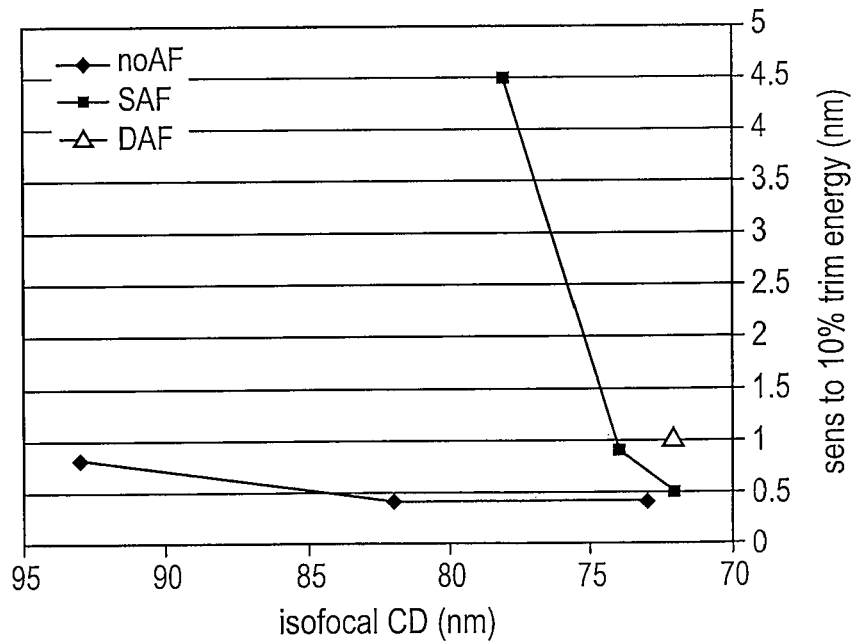
FIG. 8 is a graph depicting the sensitivity of the CD to changes in trim energy (herein also referred to as the "trim sensitivity"), plotted against isofocal CD, for several trim mask designs.

FIG. 8 is a graph of isofocal CD (in nm) against "CD sensitivity to 10% trim energy" (in nm), for several trim mask designs (with pitch=1500 nm in all the masks), plotted for the "no assist features" case (graph noAF), the single assist features case (graph SAF) and the double assist features case (DAF). The "CD sensitivity to 10% trim energy" is a measure of the change in CD with change in trim energy and is here defined as:

$$\text{Sensitivity to } 10\% \text{ trim energy} = \frac{\Delta \text{CD}}{0.1 \times \text{trim-energy}},$$

where $$\Delta CD = CD \text{ at } 1.1 \times \text{trim-energy} - CD \text{ at trim energy}$$

Figure 9:
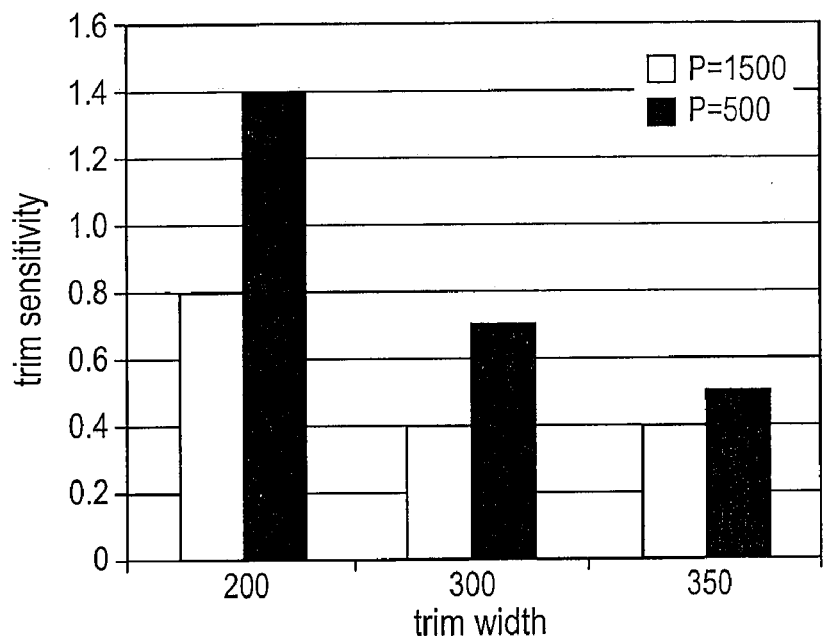
FIG. 9 is a bar graph depicting the impact of trim width on the trim sensitivity, for two different gate line pitches, P (this graph is based on simulated data)

Each plotted point corresponds to a particular trim width. FIG. 8 shows that a trim mask with scattering bars offers low isofocal CD and high CD sensitivity to trim energy at the same time. This combination is advantageous where it is desired to design the trim mask to carry out optical proximity correction (namely "pitch linearity" correction), as mentioned already above. FIG. 9 is a bar chart illustrating the impact of trim width, TW, on the trim sensitivity for the case where no assist features (i.e. no scattering bars) are included on the trim mask. The chart shows the trim sensitivity at three different trim widths (200, 300 and 400 nm) for each of two different pitches (1500 nm and 500 nm pitch). The trim sensitivity is in this case again the "CD sensitivity to 10% trim energy" as defined above. From FIG. 9 it can be seen that the trim sensitivity increases for smaller pitches and can be regulated by adjusting the trim width. It is therefore proposed that the trim width be selected so as to tune the CD sensitivity to allow for proximity correction using the trim exposure.

Figure 10:
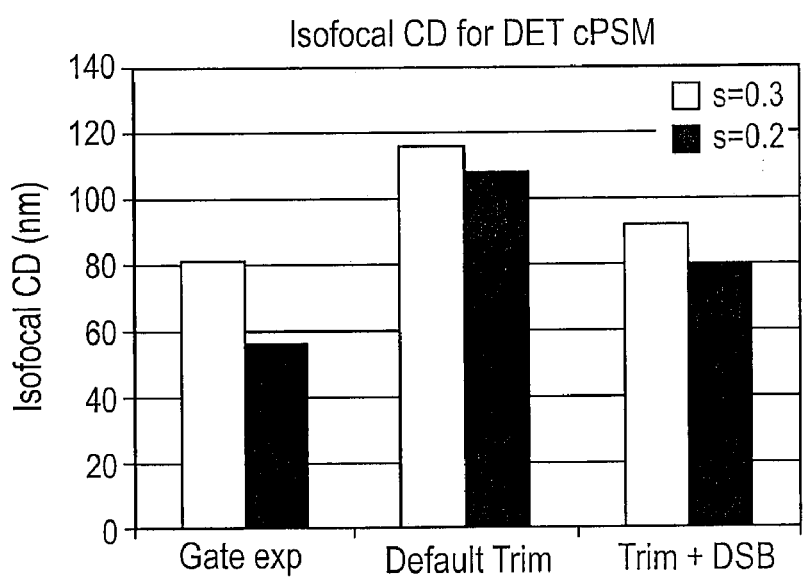
FIG. 10 is a bar graph depicting isofocal CDs obtained in a single exposure imaging process, a conventional double exposure c:PSM process, and an inventive double exposure c:PSM process.

The size (in particular the width) and position of the scattering bars can also be optimised so that the shift of the isofocal CD due to the trim mask is reduced (or minimised) and so that the scatter bars do not print on the substrate. This way the negative impact of the trim mask can be reduced (compared with conventional trim masks) and CD uniformity is improved. FIG. 10 is a bar chart based on simulated data, plotting isofocal CD (in nm), for a single exposure process, a double exposure c:PSM process using a conventional trim mask (of the type of FIG. 6(a)), and a double exposure c:PSM process using a trim mask with double scatter bars according to one embodiment of the present invention, and at each of two different trim illumination settings, $\sigma=0.2$ and $\sigma=0.3$. FIG. 10 illustrates that for a typical case with a standard (i.e. conventional) trim mask the isofocal CD increases from 80 nm for a single exposure process to 116 nm for a double exposure process. With the improved trim mask of the invention, incorporating double scattering bars of 60 nm width spaced by 120 nm from the edges of the respective gate lines, and using a trim width of 200 nm, the isofocal CD increases to just 92 nm for the double exposure process (using the same trim exposure dose).

Figure 11:
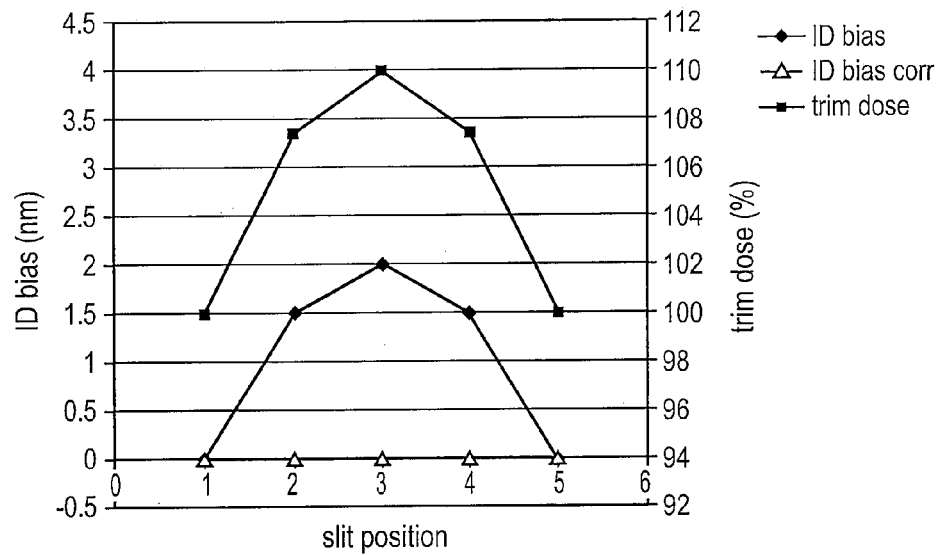
FIG. 11 is a graph illustrating iso-dense bias correction across an exposure field using a selected trim dose profile in the trim exposure of a c:PSM process.
Figure 12:
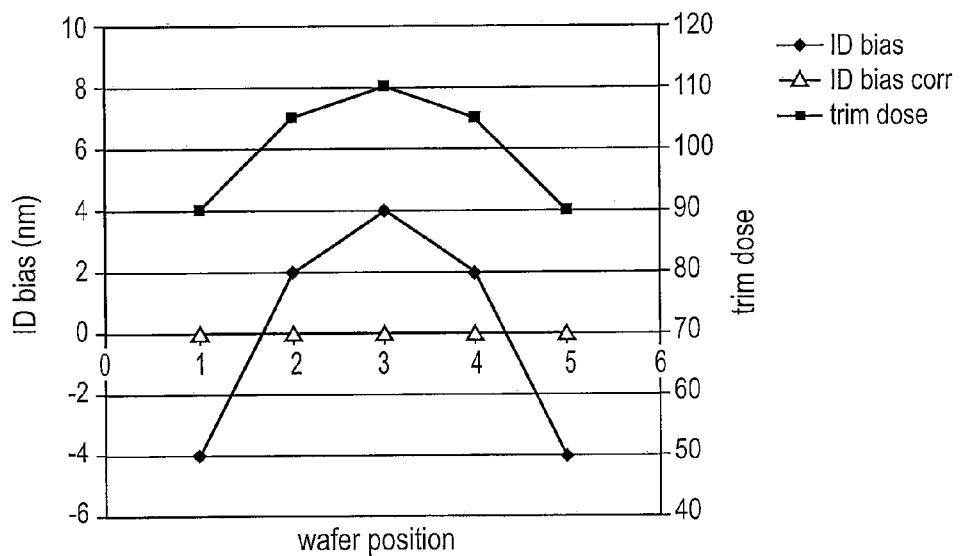
FIG. 12 is a graph illustrating iso-dense bias correction across a wafer using a selected trim dose profile in the trim exposure of a c:PSM process.

It will be appreciated that the above-described methods for controlling isofocal CD can be applied in various ways in practice in order to achieve at least some measure of optical proximity correction. For example, the exposure dose of trim energy applied by the lithographic apparatus in the second exposure can be selected in accordance with the chosen trim width, and/or the number and/or size and/or position of scattering bars on the trim mask, so as to achieve a desired proximity correction effect in the wafer/substrate. For example, if there are just two different pitches on the wafer, namely 130 nm pitch (dense) and 1500 nm pitch (iso). If the trim width TW is selected to be 200 nm then the dense pitch will only see light from the gate-defining step (i.e. the Alt:PSM mask exposure), but the iso pitch will see light from both the gate and the trim exposure steps. The difference in CD between the two pitches is often referred to as the "iso-dense bias". This iso-dense bias can be corrected by applying different trim energies. This principle can be applied by, for example:

matching different exposure systems (i.e. different lithographic machines) by applying an offset in the trim dose i.e. by setting a different trim dose for each exposure system. For example, FIG. 5 illustrates the situation where there is a proximity matching issue between different exposure systems due to a sigma ($\sigma$) mismatch. With the appropriate trim mask design and delta trim energy the effect of the sigma on the pitch linearity can be compensated;

correction of proximity effects across an image exposure field by dose mapping with the trim exposure. In this case, by using a predetermined dose profile for the trim step, iso-dense bias can be corrected. See, for example, FIG. 11 which illustrates a non-uniform trim dose applied across an exposure field, the dose profile being designed to compensate for iso-dense bias over the same exposure field. In FIG. 11, the iso-dense bias along the Y-axis is plotted against the "slit position" along the x-axis, where the term "slit position" is used to refer to the x-coordinate of the position in the exposure field. This term is sometimes alternatively referred to as the "slot". So, for example, if the exposure field measures 26×33 mm, the slit positions range from −13 to +13 mm;

correction of proximity effects across the wafer. Again, a non-uniform trim dose profile across the wafer can be set using the exposure system, so as to compensate for iso-dense bias over the wafer. This is illustrated in FIG. 12.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein. For example the computer program may be a mask design program for designing a trim mask (including optimizing scattering bars, trim width etc. as above-described). The program may also include machine-readable instructions (i.e. code) for designing an alternating phase shift mask as above-described.

The descriptions above are intended to be illustrative, not limiting. Thus, it will be apparent to one skilled in the art that modifications may be made to the invention as described without departing from the scope of the claims set out below. For example, in some cases the exposure order of the c:PSM process may be reversed, so that the trim exposure is carried out prior to the alt:PSM exposure.

What is claimed is:

1. A device manufacturing method utilizing a complementary phase shift mask (c:PSM) imaging technique, the method comprising:
projecting a first patterned beam of radiation onto a target portion of a substrate, said first patterned beam being formed using an alternating phase shift mask exposed to a first beam of radiation;
projecting a second patterned beam of radiation onto the target portion of the substrate, said second patterned beam being formed using a trim mask exposed to a second beam of radiation, wherein the trim mask includes a protective shadow region to protect features formed on the target portion of the substrate using the first patterned beam of radiation;
wherein the exposure dose of the second beam is selected in accordance with a width of the protective shadow region or the width of the protective shadow region is selected in accordance with the exposure dose of the second beam, so as to achieve a particular critical dimension correction for a particular pitch at a reduced trim sensitivity relative to that for an exposure using the trim mask using the particular pitch without the selected exposure dose or selected width.

2. A device manufacturing method according to claim 1, wherein the exposure dose of the second beam is selected in accordance with the width of the protective shadow region so as to achieve a desired critical dimension (CD) of one or more predetermined features formed on the target portion of the substrate as a result of the device manufacturing method.

3. A device manufacturing method according to claim 1, wherein the width of the protective shadow region is selected in accordance with the exposure dose of the second beam so as to achieve a desired level of sensitivity of the critical dimension (CD) of one or more predetermined features to be formed on the target portion of the substrate.

4. A device manufacturing method according to claim 1, wherein the alternating phase shift mask has a plurality of gate lines and a plurality of phase shifter regions formed thereon, each gate line being sandwiched between two said phase shifter regions, and wherein the alternating phase shift mask further includes a plurality of dummy regions formed thereon, each dummy feature being disposed adjacent a said phase shifter region.

5. A device manufacturing method according to claim 1, wherein the alternating phase shift mask is a dark field alternating phase shift mask.

6. A device manufacturing method according to claim 1, wherein projecting the first patterned beam of radiation onto a target portion of a substrate is performed before projecting the second patterned beam of radiation on the target portion of the substrate.

7. A device manufacturing method utilizing a complementary phase shift mask (c:PSM) imaging technique, the method comprising:
projecting a first patterned beam of radiation onto a target portion of a substrate, said first patterned beam being formed using an alternating phase shift mask exposed to a first beam of radiation;
projecting a second patterned beam of radiation onto the target portion of the substrate, said second patterned beam being formed using a trim mask exposed to a second beam of radiation;
wherein the trim mask has at least one scattering bar provided thereon, the number, size and position of the at least one scattering bar of the trim mask optimized so as to achieve a lower isofocal CD and higher trim sensitivity relative to that for an exposure using the trim mask without the at least one scattering bar for predetermined features to be formed on the target portion of the substrate using the c:PSM imaging process.

8. A device manufacturing method according to claim 7, wherein the exposure dose applied during the trim exposure has a non-uniform profile across the exposure field, said profile being shaped so as to achieve at least some optical proximity correction.

9. A device manufacturing method according to claim 7, wherein the exposure dose applied during the trim exposure has a non-uniform profile across the substrate, said profile being shaped so as to achieve at least some optical proximity correction.

10. A device manufacturing method according to claim 7, wherein a plurality of different exposure systems are used, the different exposure systems have different illumination settings, and wherein a different trim energy is applied by the different systems in the trim exposure, the trim mask design and the difference in applied trim energy between exposure systems being selected so as to at least partially compensate for optical proximity mismatch effects between the different exposure systems.

11. A device manufacturing method according to claim 7, wherein the alternating phase shift mask has a plurality of gate lines and a plurality of phase shifter regions formed thereon, each gate line being sandwiched between two said phase shifter regions, and wherein the alternating phase shift mask further includes a plurality of dummy regions formed thereon, each dummy feature being disposed adjacent a said phase shifter region.

12. A device manufacturing method according to claim 7, wherein the alternating phase shift mask is a dark field alternating phase shift mask.

13. A device manufacturing method according to claim 7, wherein projecting the first patterned beam of radiation onto a target portion of a substrate is performed before projecting the second patterned beam of radiation on the target portion of the substrate.

14. A device manufacturing method according to claim 7, wherein the trim mask has a plurality of protective shadow regions provided thereon and wherein a scattering bar is disposed on either side of each said protective shadow region.

15. A device manufacturing method according to claim 7, wherein the trim mask has a plurality of protective shadow regions provided thereon and wherein at least two scattering bars are disposed on either side of each said protective shadow region.

16. A device manufacturing method utilizing a complementary phase shift mask (c:PSM) imaging technique, the method comprising:

projecting a first patterned beam of radiation onto a target portion of a substrate, said first patterned beam being formed using a trim mask exposed to a first beam of radiation having a trim exposure dose;

projecting a second patterned beam of radiation onto the target portion of the substrate, said second patterned beam being formed using an alternating phase shift mask exposed to a second beam of radiation;

wherein the trim mask has at least one scattering bar provided thereon, the number, size and position of the at least one scattering bar of the trim mask is selected such that the at least one scattering bar does not print on the substrate and is selected so as to provide reduced isofocal critical dimension relative to that for an exposure using the trim mask without the at least one scattering bar using the trim exposure dose.

17. A device manufacturing method according to claim 16, wherein projecting the second patterned beam of radiation onto a target portion of a substrate is performed before projecting the first patterned beam of radiation on the target portion of the substrate.

18. A device manufacturing method utilizing a complementary phase shift mask (c:PSM) imaging technique, the method comprising:

projecting a first patterned beam of radiation onto a target portion of a substrate, said first patterned beam being formed using an alternating phase shift mask exposed to a first beam of radiation;

projecting a second patterned beam of radiation onto the target portion of the substrate, said second patterned beam being formed using a trim mask exposed to a second beam of radiation;

wherein the trim mask has a plurality of protective shadow regions provided thereon and wherein a scattering bar is disposed on either side of each said protective shadow region to obtain a lower isofocal critical dimension for a width of the protective shadow region between 100 nm and 300 nm relative to that for an exposure using the trim mask without the scattering bar.

19. A device manufacturing method according to claim 18, wherein at least two scattering bars are disposed on either side of each said protective shadow region.

20. A device manufacturing method according to claim 18, wherein the trim mask is a binary chrome on glass trim mask.

21. A machine readable medium comprising machine executable instructions for performing a method utilizing a complementary phase shift mask (c:PSM) imaging technique, the method comprising:

projecting a first patterned beam of radiation onto a target portion of a substrate, said first patterned beam being formed using an alternating phase shift mask exposed to a first beam of radiation;

projecting a second patterned beam of radiation onto the target portion of the substrate, said second patterned beam being formed using a trim mask exposed to a second beam of radiation, wherein the trim mask includes a protective shadow region to protect features formed on the target portion of the substrate using the first patterned beam of radiation;

wherein the exposure dose of the second beam is selected in accordance with a width of the protective shadow region or the width of the protective shadow region is selected in accordance with the exposure dose of the second beam, so as to achieve a particular critical dimension correction for a particular pitch at a reduced trim sensitivity relative to that for an exposure using the trim mask using the particular pitch without the selected exposure dose or selected width.

* * * * *